(12) United States Patent
Uda et al.

(10) Patent No.: US 7,052,825 B2
(45) Date of Patent: May 30, 2006

(54) SUBSTRATE HAVING FINE LINES, METHOD FOR MANUFACTURING THE SAME, ELECTRON-SOURCE SUBSTRATE, AND IMAGE DISPLAY APPARATUS

(75) Inventors: Yoshimi Uda, Kanagawa (JP); Kazuya Ishiwata, Kanagawa (JP); Shinsaku Kubo, Kanagawa (JP); Yasuyuki Watanabe, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/781,790

(22) Filed: Feb. 20, 2004

(65) Prior Publication Data

US 2004/0161703 A1   Aug. 19, 2004

Related U.S. Application Data

(62) Division of application No. 10/003,236, filed on Dec. 6, 2001, now Pat. No. 6,720,120.

(30) Foreign Application Priority Data

Dec. 15, 2000 (JP) .............. 2000/382331
Nov. 21, 2001 (JP) .............. 2001/356554

(51) Int. Cl.
G03F 7/00 (2006.01)

(52) U.S. Cl. .............. 430/322; 430/313; 430/320
(58) Field of Classification Search .............. 430/313, 430/320, 322
See application file for complete search history.

(56) References Cited

U.S. PATENT DOCUMENTS

| 4,264,714 A | * | 4/1981 | Trausch .............. 430/320 |
| 5,012,500 A | | 4/1991 | Watanabe et al. .............. 378/35 |
| 5,052,033 A | | 9/1991 | Ikeda et al. .............. 378/35 |
| 5,125,014 A | | 6/1992 | Watanabe et al. .............. 378/34 |
| 5,335,259 A | | 8/1994 | Hayashida et al. .............. 378/161 |
| 5,444,753 A | | 8/1995 | Hayashida et al. .............. 378/35 |
| 5,461,657 A | | 10/1995 | Hayashida et al. .............. 378/84 |

(Continued)

FOREIGN PATENT DOCUMENTS

EP    0 683 045 A2    11/1995

(Continued)

OTHER PUBLICATIONS

European Search Report dated Dec. 12, 2005, issued in corresponding European patent appln. No. EP 01 12 9594, forwarded in a Communication dated Dec. 21, 2005.

*Primary Examiner*—Nicole Barreca
(74) *Attorney, Agent, or Firm*—Fitzpatrick, Cella, Harper & Scinto

(57) ABSTRACT

A substrate includes fine lines. The fine lines are obtained according to a fine-line forming process, which includes a process of projecting light from above the substrate onto predetermined regions on a photosensitive material provided on the substrate and a developing process after the light projection process. A narrow-width portion is provided at an end portion of each of the fine lines in a longitudinal direction of the fine line. The width of the narrow-width portion is smaller than the width of a portion adjacent to the narrow-width portion.

2 Claims, 18 Drawing Sheets

U.S. PATENT DOCUMENTS

| | | | |
|---|---|---|---|
| 5,503,950 A | 4/1996 | Miyake et al. | 430/5 |
| 5,593,335 A * | 1/1997 | Suzuki et al. | 445/50 |
| 5,604,779 A | 2/1997 | Amemiya et al. | 378/34 |
| 5,839,363 A | 11/1998 | Yanagisawa et al. | 101/123 |
| 5,914,763 A | 6/1999 | Fujii et al. | 349/149 |
| 6,226,060 B1 | 5/2001 | Onisawa et al. | 349/43 |
| 6,272,202 B1 | 8/2001 | Chiba et al. | 378/34 |
| 6,317,479 B1 | 11/2001 | Chiba et al. | 378/35 |
| 6,340,558 B1 * | 1/2002 | Kubota et al. | 430/320 |
| 6,404,473 B1 | 6/2002 | Kaneko et al. | 349/139 |
| 6,522,378 B1 | 2/2003 | Mizuno et al. | 349/139 |

FOREIGN PATENT DOCUMENTS

| | | |
|---|---|---|
| EP | 0 932 180 A1 | 7/1999 |
| JP | 5-38874 | 2/1993 |
| JP | 7-183301 | 7/1995 |
| JP | 8-34110 | 2/1996 |
| JP | 9-218418 | 8/1997 |
| JP | 10-268339 | 10/1998 |
| JP | 11-145595 | 5/1999 |
| JP | 2000-323046 | 11/2000 |

* cited by examiner

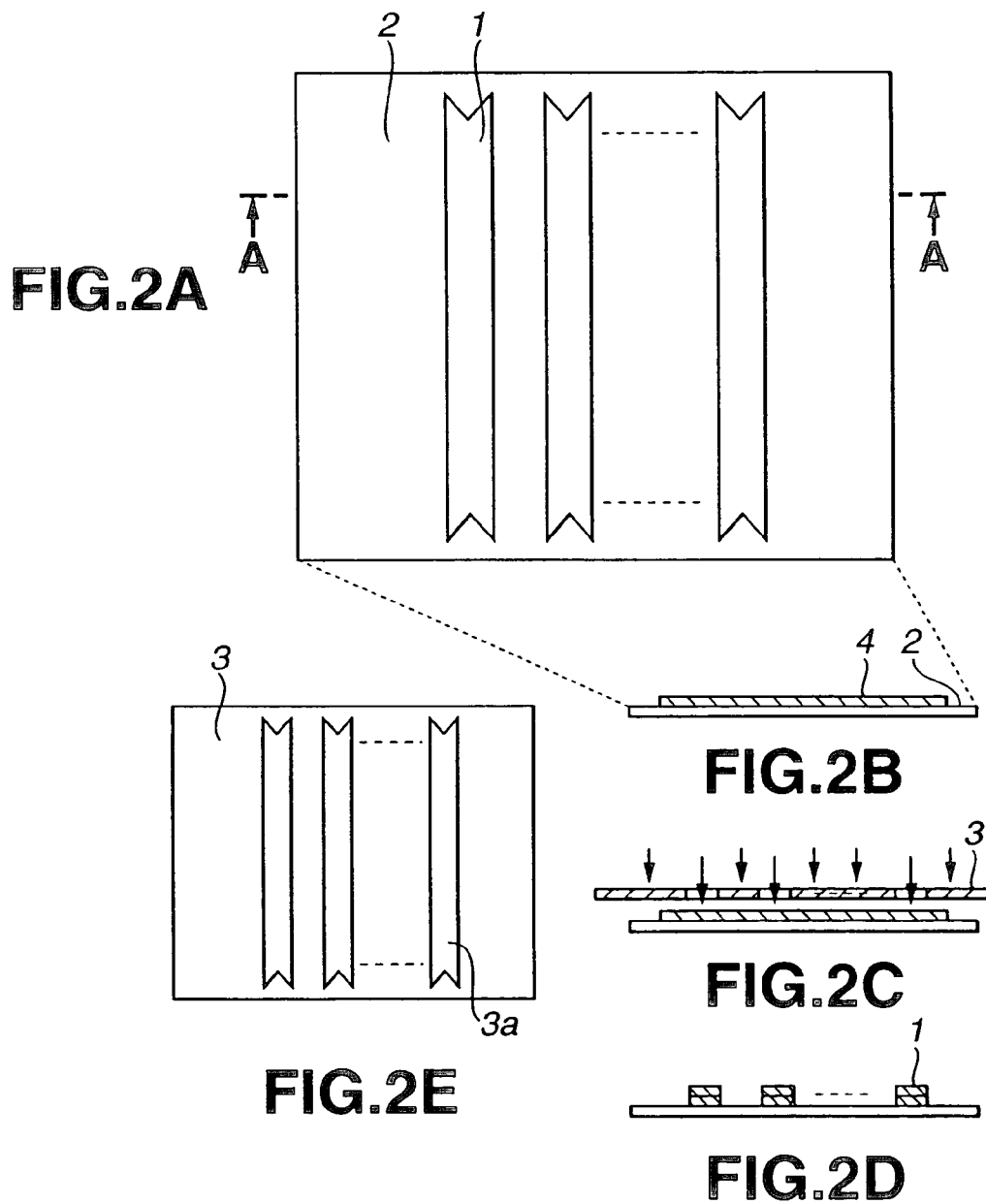

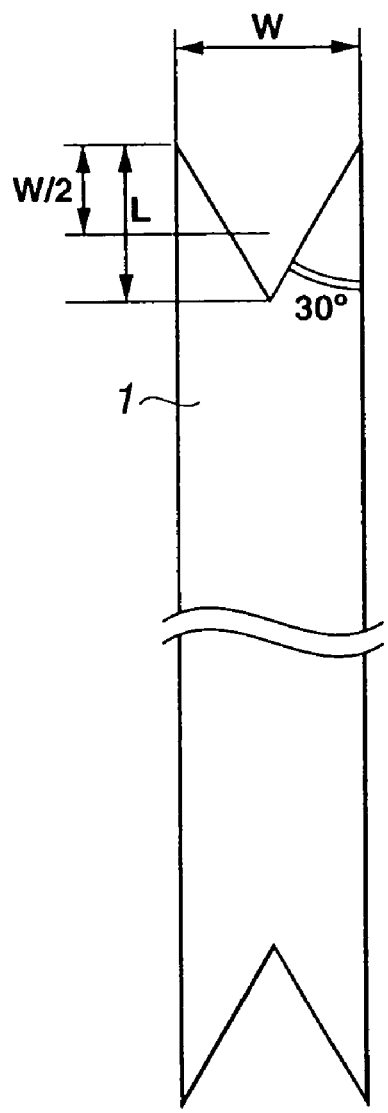 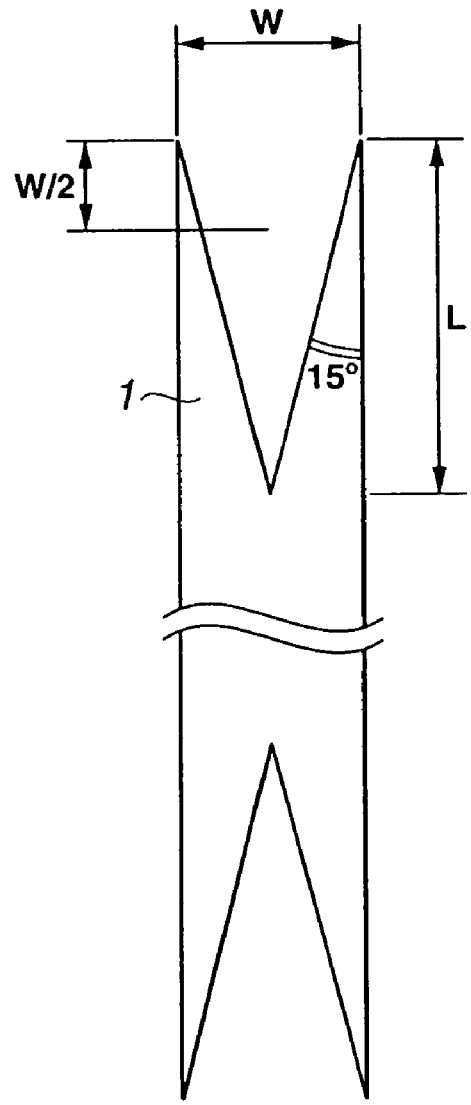
FIG.5A  FIG.5B

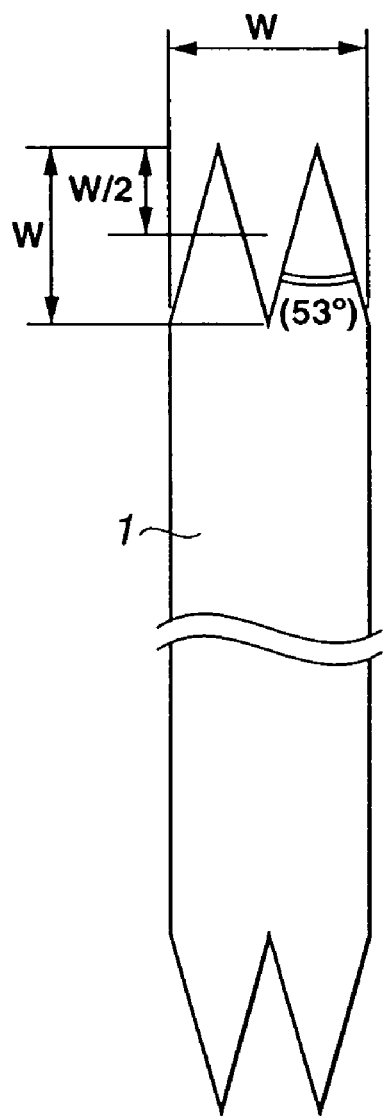
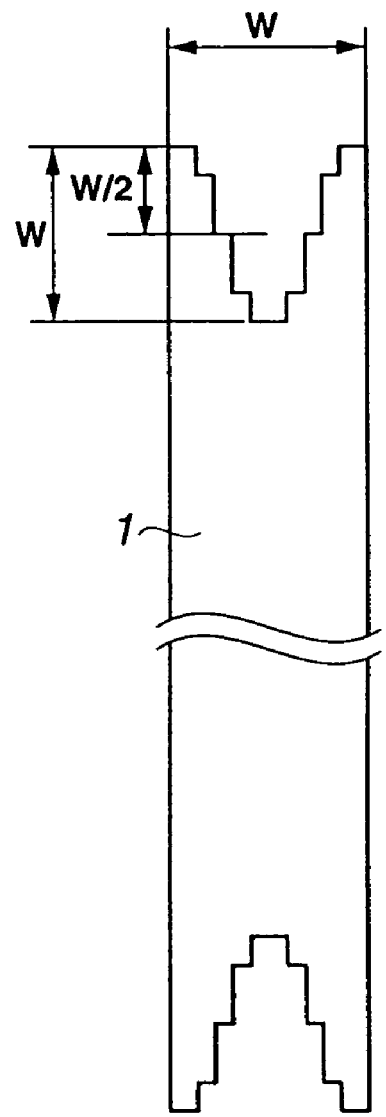
FIG.6A  FIG.6B

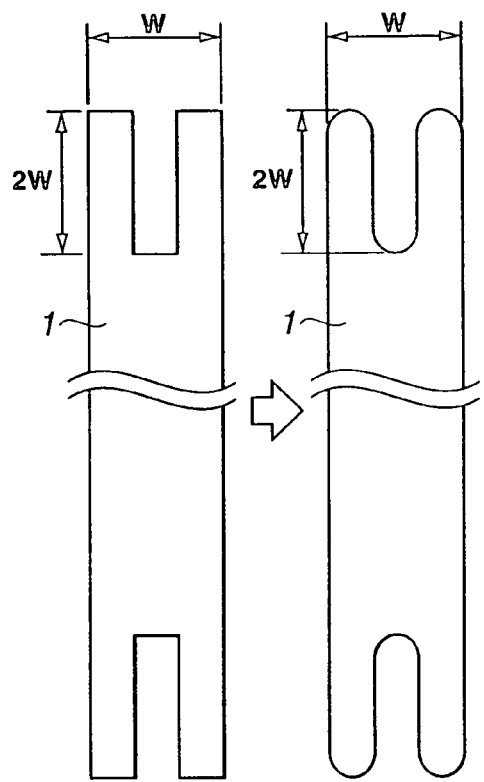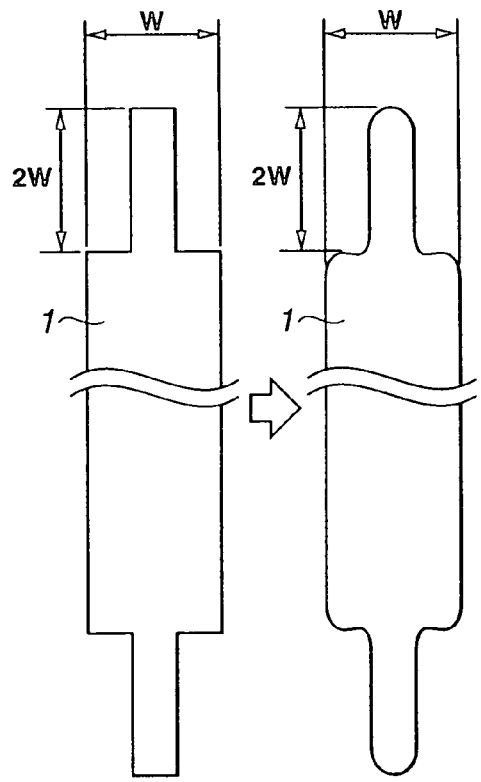
FIG.9A  FIG.9B  FIG.9C  FIG.9D

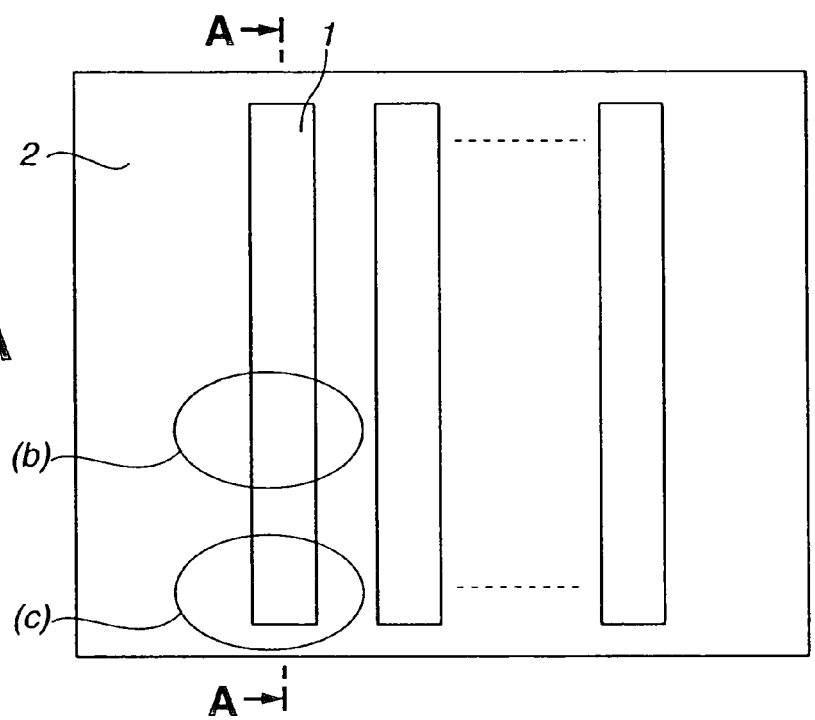
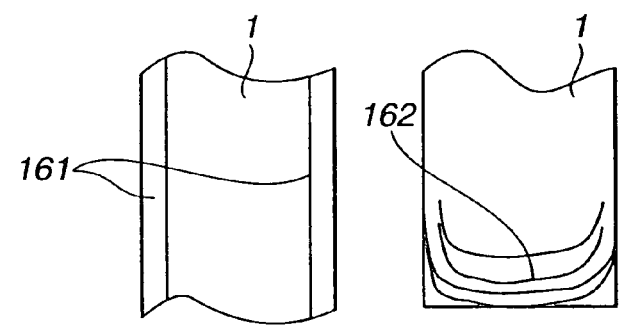
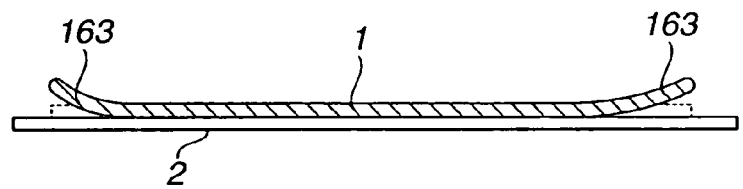
FIG.16A
FIG.16B   FIG.16C
FIG.16D

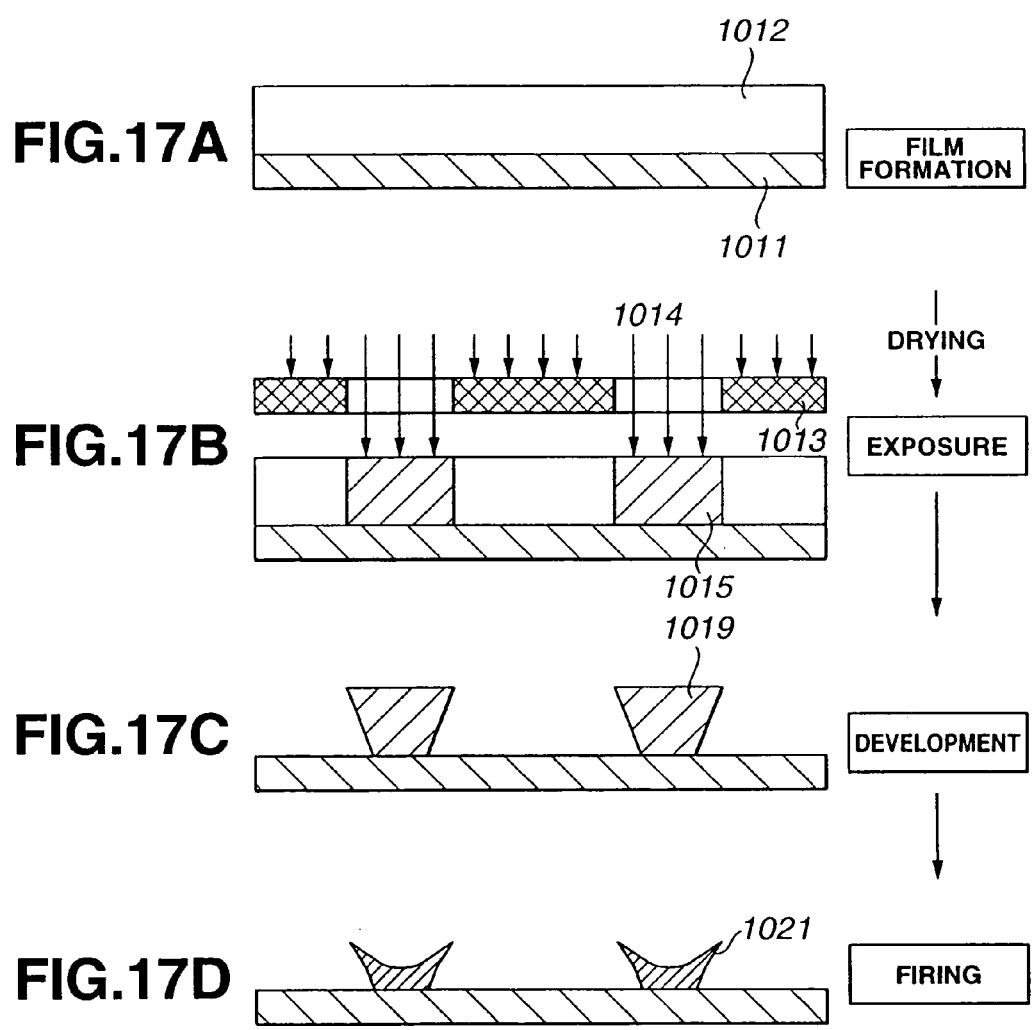

SUBSTRATE HAVING FINE LINES, METHOD FOR MANUFACTURING THE SAME, ELECTRON-SOURCE SUBSTRATE, AND IMAGE DISPLAY APPARATUS

This application is a divisional of U.S. patent application Ser. No. 10/003,236, filed Dec. 6, 2001, now U.S. Pat. No. 6,720,120.

BACKGROUND OF THE INVENTION

1. Field of the Invention

The present invention relates to a substrate having fine lines, and a method for manufacturing the same. Particularly, the invention relates to a configuration in which the fine lines are wires provided on the substrate, and a configuration in which a technique for providing the fine lines are applied to an electron-source substrate and an image forming apparatus.

2. Description of the Related Art

FIG. 14A is a plan view illustrating a surface-conduction-type electron emitting device. FIG. 14B is a cross-sectional view taken along line B–B' shown in FIG. 14A. In FIGS. 14A and 14B, there are shown an insulating substrate 2, a conductive film 15, electrodes 11 and 12, and an electron emitting portion 16.

FIG. 15 is a schematic diagram illustrating the configuration of an image display apparatus which uses electron emitting devices 100, each such as the one shown in FIGS. 14A and 14B. In FIG. 15, there are shown a substrate 151, an external frame 152, and a faceplate 156 having an image forming member 154 disposed thereon.

An envelope (air-tight container) 157 for maintaining the inside of the image display apparatus in a vacuum by sealing respective connecting portions between corresponding ones of the external frame 152, the substrate 151 and the faceplate 153 using a bonding material (not shown), such as a low-melting-point glass frit or the like, is provided.

A substrate 158 is fixed on the substrate 151. The electron emitting devices 100 whose number equals N×M (N and M are positive integers equal to or more than 2, appropriately selected in accordance with the number of pixels for displaying an image) are formed by being arranged on the substrate 158. Each of the electron emitting devices 100 is connected to corresponding ones of wires 159 and 160, each made of a conductive film.

In FIG. 15, M column-direction wires 159 and N row-direction wires 160 (also called "matrix wires") are provided. Insulating layers (not shown) are provided at intersections of the row-direction wires 160 and the column-direction wires 159, so that the row-direction wires 160 are insulated from the column-direction wires.

In order to form the above-described image display apparatus, it is necessary to form and arrange a large number of row-direction wires 160 and column-direction wires 159.

In order to form and arrange a large number of thick row-direction wires 160 and column-direction wires 159, for example, Japanese Patent Application Laid-Open (Kokai) No. 8-34110 (1996) discloses a method of using a printing technique which is relatively inexpensive, does not require a vacuum apparatus and the like, and can deal with a large area.

In addition to the above-described surface-conduction-type electron emitting devices, for example, spindt-type electron emitting devices, each having a cone-shaped electron emitting portion, and MIM(metal-insulator-metal)-type electron emitting devices have been known as the electron emitting devices. By being combined with a phosphor emitting light by electrons emitted from an electron emitting device, the electron emitting device can be used as an image display device. In addition to the above-described electron emitting devices, for example, EL (electroluminescent) devices have been known as image display devices. A configuration in which an image is displayed by using very small integrated mirrors as image display devices and controlling reflection of light by the very small mirrors has also been known. A configuration in which an image is displayed using liquid-crystal devices as image display devices has also been practically used widely.

Japanese Utility-Model Application Laid-Open (Kokai) No. 5-38874 (1993) discloses another background technique. This application discloses a technique in which in order to connect two conductive films facing each other, resistive films are superposed on respective end portions of the two conductive films. Particularly, in order to prevent growth of cracks in each of the resistive films at a step portion of superposition into a single large crack, the end portion of the conductive film is formed with a crooked line comprising lines or curves, having a saw-tooth shape, a comb-like shape, a wavy shape or the like.

SUMMARY OF THE INVENTION

The inventors of the present invention have studied a configuration in which, when forming fine lines on a substrate, the fine lines are obtained according to exposure and development. More specifically, a photosensitive material is used for forming fine lines, and the fine lines are obtained by selectively exposing predetermined regions followed by development. The studies by the inventors of the present invention have cleared that fine lines obtained according to this approach tend to peel from the substrate particularly at end portions of the fine lines in the longitudinal direction.

According to the present invention, the problem that fine lines are peeled when an exposure/development process is included in processes for forming the fine lines is solved.

That is, in a substrate including fine line, the fine line is obtained according to a fine-line forming process including a process of projecting light from above the substrate onto predetermined region on a photosensitive material provided on the substrate and a developing process after the light projection process. A narrow-width portion is provided at an end portion of the fine line in a longitudinal direction of the fine line. A width of the narrow-width portion is smaller than a width of a portion adjacent to the narrow-width portion.

According to the invention, it is possible to suppress peeling of end portions peculiar to fine lines formed according to the fine-line forming process including the exposure process and the developing process.

The following two configurations have been known as configurations in which unnecessary portions are removed by forming a latent image by projecting light onto predetermined regions and developing the latent image. Both of the two configurations may be applied to the present invention. In one of the two configurations, a latent image is formed by portions where light having an intensity sufficient enough for forming a latent image has been projected, and portions where light having an intensity insufficient for forming a latent image has been projected are removed by development. In another configuration, a latent image is formed by portions other than portions where light having an intensity sufficient enough for being removed by development has been projected, and portions other than portions where the latent image is formed are removed by development. The latent image in this specification corresponds to portions which are not removed even by development, and therefore is not limited to an invisible image.

The present invention is particularly suitable when the fine line is obtained by being heated after the developing process, because it is considered that a stress generated when the size of the material obtained by development changes due to the heating is a great factor for peeling of end portions. The present invention is particularly suitable when the fine line obtained by the heating has a width smaller than a width of the material after the developing process and before the heating.

The present invention is particularly suitable when the fine line obtained by the heating has a thickness equal to or more than 5 µm.

The present invention is particularly suitable when the material immediately before projecting the light has a thickness equal to or more than 8 µm.

The fine line according to the present invention may be suitably adopted as wire.

The present invention is particularly suitable when the material is a metal paste, or when silver is contained as a main component for providing a conductive property.

A configuration in which the end portion has a cut provided from a distal end of the end portion such that the end portion is divided into at least two portions, or a configuration in which the end portion is chamfered from a distal end of the end portion may also be preferably adopted. The above-described cut or chamfer is not always formed by first providing a shape in which the cut or the chamfer is absent, and then performing cutting or chamfering. A shape in which the cut or the chamfer is present may be simultaneously formed according to light projection and subsequent development.

It is particularly preferable that a length of the narrow-width portion in the longitudinal direction is at least half a width of a portion adjacent to the narrow-width portion.

A configuration in which a portion of the end portion where the width gradually decreases toward a distal end of the end portion is provided as the narrow-width portion may be preferably adopted.

According to the present invention, a method for manufacturing a substrate having fine line includes a fine-line forming step for forming the fine line. In the fine-line forming step, a narrow-width portion is provided at an end portion of the fine line in a longitudinal direction, and the fine line is formed so that a width of the narrow-width portion is smaller than a width of a portion adjacent to the narrow-width portion. The fine-line forming step includes a step of providing a photosensitive material onto the substrate, a step of projecting light from above the substrate onto predetermined region on the material, and a developing step after the light projection step.

According to this method, it is possible to preferably manufacture a substrate having fine lines whose end portions hardly peel. It is particularly preferable to simultaneously form the shape of the end portion according to the light projection step and the developing step.

The present invention also provides an electron-source substrate including the above-described substrate and electron emitting device provided on the substrate. The fine line is wire for supplying the electron emitting device with a signal for driving the electron emitting device.

A configuration in which a plurality of the electron emitting devices are provided, and the plurality of electron emitting devices are arranged in the shape of a matrix, and a plurality of the wires perform matrix connection of the plurality of electron emitting devices arranged in the shape of the matrix may be preferably adopted.

The present invention also provides an image display apparatus including the above-described substrate and image display devices, in which the fine lines are wires for supplying the image display devices with a signal for driving the image display devices.

BRIEF DESCRIPTION OF THE DRAWINGS

FIGS. 2A–2D are diagrams illustrating a process for forming the wires shown in FIG. 1 on a substrate;

FIGS. 5A and 5B are schematic diagrams illustrating views according to Example 2 of the present invention;

FIGS. 6A and 6B are schematic diagrams, each illustrating a wire according to Example 3 of the present invention;

FIGS. 9A–9D are schematic diagrams, each illustrating a wire according to Example 6 of the present invention;

FIGS. 16A–16D are schematic diagrams illustrating cracks in a wire and peeling of a wire on a substrate;

FIGS. 17A–17D are diagrams illustrating a process for forming fine wires according to an exposure/development method and the shape pf the cross section of each wire.

DETAILED DESCRIPTION OF THE PREFERRED EMBODIMENTS

Figure 1:
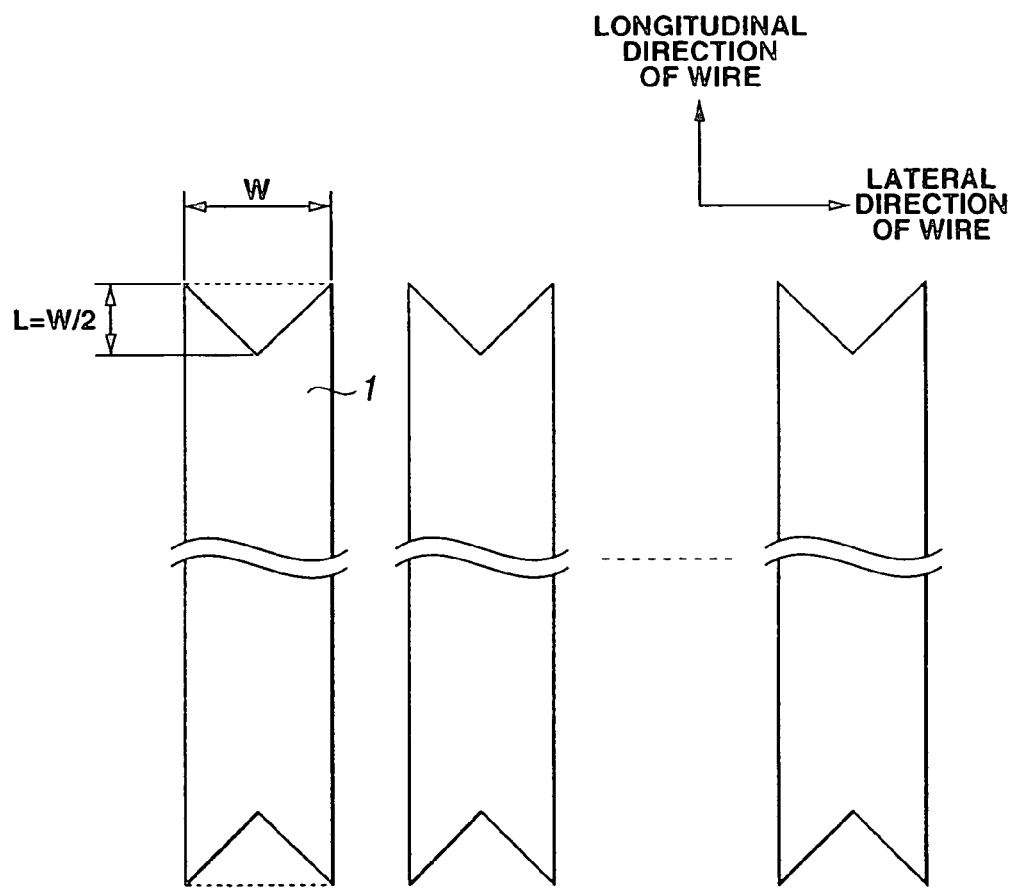
FIG. 1 is a schematic diagram illustrating wires according to Example 1 of the present invention.

A preferred embodiment of the present invention will now be described. First, how the above-described problems arise will be described in detail illustrating the basic configuration of the embodiment.

FIGS. 17A–17D illustrate a process for forming fine lines using a photosensitive paste (a paste containing a photosensitive substance) as the material for the fine wires. The process for forming the fine lines using the photosensitive paste is performed in the order of formation of a film of the photosensitive paste→(drying)→exposure→development→firing.

In FIGS. 17A–17D, there are shown a substrate 1011, a photosensitive paste 1012, a mask 1013, exposing light 1014, a latent image 1015, a developed pattern 1019, serving as a developed image, and an accomplished wire pattern 1021.

FIG. 17A illustrates a film forming process, FIG. 17B illustrates an exposure process, FIG. 17C illustrates a developing process, and FIG. 17D illustrates a firing process.

As can be understood from the developed pattern 1019, the width of a lower portion (facing a surface of the substrate 1011 where the exposing light 1014 is projected) is smaller than the width of an upper portion (the surface of the photosensitive paste 1012 where the exposing light 1014 is projected) in the cross section of the developed pattern 1019 cut in the direction of a normal with respect to the surface of the substrate 1011. It is considered that this is because the exposing light 1014 is attenuated while passing through the material for the fine lines. Even when the width of the developed pattern 1019 does not clearly differ between the upper portion and the lower portion, the shape of the lower portion sometimes becomes incorrect due to attenuation of the exposing light 1014. In FIGS. 17A–17D, the case that exposed portions remain as fine lines by development has been illustrated. However, even in a configuration in which exposed portions are removed by development, a phenomenon such that, for example, the shape of portions of fine lines facing the substrate becomes incorrect will also occur.

In addition to the above-described configuration that the shape of fine lines is provided by exposure, a configuration in which a material for fine lines is provided only to portions corresponding to the desired pattern of fine lines according to printing, such as screen printing or the like, has been known. In this configuration, however, since end portions of the material for fine lines provided on the substrate loosen, it is difficult to maintain a sharp or correct shape. Although it is difficult to maintain a sharp or correct shape due to loosening of the material, the presence of loosening will prevent peeling of fine lines at end portions.

The present invention intends to solve the above-described problem of peeling of end portions which will occur when intending to provide fine lines having a correct and sharp shape by defining the shape by exposure.

The inventors of the present invention have intensively studied this problem, and found that peeling of end portions, particularly in the longitudinal direction, of fine lines formed according to a fine-line forming process including an exposure process can be prevented by reducing the width (the length of contact of a fine line with the substrate in a direction substantially orthogonal to the longitudinal direction of the fine line and parallel to the surface of the substrate) of an end portion of the fine line. The reduction of the width of the end portion indicates making the width of a predetermined portion (a narrow-width portion) of the end portion to be smaller than the width of a portion adjacent to the narrow-width portion When increasing the thickness of fine lines in a configuration in which the fine lines are formed on a substrate where cracks tend to occur, such as a glass substrate or the like, it may happen that cracks are produced in glass at a portion where end portions of the fine lines contact the substrate (hereinafter termed "end-portion cracks"), or cracks are produced in glass in a direction parallel to the longitudinal direction of the fine lines (hereinafter termed "side cracks"). Furthermore, an end-portion crack is sometimes connected to a side crack in a state of being magnified. It has become clear that by reducing the width of end portions of fine lines as in the present invention, it is possible to suppress end-portion cracks as well as the phenomenon that an end-portion crack is connected to a side crack.

The above-described problems will now be described with reference to FIGS. 16A–16D. FIG. 16A illustrates a state in which a plurality of rectangular (line-shaped) fine lines 1 have been formed and fired on a glass substrate 2. In FIG. 16B, a portion (b) shown in FIG. 16A is seen from the back in a magnified state. As shown in FIG. 16B, side cracks 161 are sometimes produced in a direction substantially parallel to the longitudinal direction of the fine line 1. The side cracks 161 are often produced at two sides more or less inside in a lateral direction of the fine line 1.

In FIG. 16C, a portion (c) shown in FIG. 16A is seen from the back in a magnified state. As shown in FIG. 16C, end-portion cracks 162 having a shell-like pattern are sometimes produced at an end portion of the fine line 1. FIG. 16D is a schematic diagram illustrating peeling 163 of the fine line 1 in a state in which the fine line 1 is seen from a side of the substrate 2 (across line A—A shown in FIG. 16A). Large peeling 163 as shown in FIG. 16D sometimes occurs. The probability of generation of such peeling of end portions of the fine line and end-portion cracks and side cracks in the fine line is larger as the thickness of the fine line is larger, and as the number of firing operations is larger.

The problems of occurrence of peeling of end portions of a fine line, end-portion cracks, and connection of an end-portion crack and a side crack in a configuration in which a pattern of fine lines is formed by exposure pronouncedly arise if the thickness of the material for the fine lines immediately before exposure is at least 8 µm. In conditions for providing a thickness of fine lines after firing equal to or more than 5 µm, particularly as the thickness is larger, such as (at least) 10 µm, (at least) 12 µm, and (at least) 18 µm, the probability of occurrence of cracks in a fine line and peeling of a fine line, and the degree of cracks and peeling are larger.

In this embodiment, a configuration in which the above-described fine lines are conductive and are used as wires will be described. If there exist peeling of a wire or end-portion cracks in an end portion of a wire in the above-described manner, for example, the problem that in device mounting using a flexible printed circuit board or tabs executed at a post-process, device mounting cannot be performed due to overall peeling of the flexible printed circuit board or the tabs at leading portions of wires, the problem of short circuit due to peeling of an end portion of a wire and contact of the peeled end portion with another portion, the problem of short circuit due to chipping or leaving of a wire, or the problem of instability of the shapes of various markers, such as line markers and the like, may arise.

By reducing the width of an end portion of a fine line (so as to be smaller than the width of a portion adjacent to the end portion), peeling of the end portion of the fine line can be suppressed. It is considered that this is because strain energy applied to the end portion of the fine line is mitigated by reducing the width of the end portion. A configuration in which the width of the end portion of the fine line is gradually (stepwise or continuously) reduced as adopted in the following examples is particularly suitable because the strain energy can be gradually mitigated. In addition, the distance of mitigation of the strain energy can be increased.

In an electron-source substrate or an image forming apparatus including fine lines of the present invention as wires, peeling of end portions of the fine lines can be very well suppressed. Since peeling of end portions of the fine lines, and side cracks and end-portion cracks are suppressed, it is possible to realize fine lines which can be preferably used for various applications, and apply the fine lines to various apparatuses having fine lines.

Examples of substrates including fine lines according to the present invention, configurations in which the technique for forming the fine lines is applied to wires, and particularly, image display apparatuses, each using the fine lines of the invention as wires on an electron-source substrate will now be illustrated with reference to the drawings. Unless particularly mentioned, the scope of the present invention is not limited to the size, the material, the shape and relative arrangement of each component described in the examples.

FIG. 1 and FIGS. 5A–9D are schematic diagrams illustrating wires according to the examples. In FIG. 1 and FIGS. 5A–9D, reference numeral 1 represents a wire, serving as a fine line, according to the examples.

Each wire in the examples has a uniform width. The width of an end portion of the wire 1 in the longitudinal direction is made narrower than the width of a central portion of the wire 1 in the longitudinal direction. The "width" in the examples indicates the length of contact of the wire 1 with the substrate 2 in a direction substantially orthogonal to the longitudinal direction of the wire 1. The longitudinal direction of the fine line (wire) indicates the direction of the length of the fine line if the fine line is rectilinear. If the fine line has a curved or bent portion, the longitudinal direction is also curved or bent. In such a case, a longitudinal direction near an end portion is adopted. If at least one of facing side portions of a wire is nonparallel, a direction obtained by connecting midpoints of the facing side portions is made the longitudinal direction. The expression "the width is made narrower" or "the width is reduced" is not limited to a case in which the width is simply reduced from a portion to start width reduction toward the distal end, but includes a case in which a fine line is divided in the lateral direction and the sum of the widths of respective divided portions are narrower than the width of a portion to start width reduction.

The shapes of wires in the examples are classified into two patterns, i.e., a pattern in which the width of an end portion of the wire 1 is reduced by forming a cut (recess) in the longitudinal direction (or in a direction substantially parallel to the longitudinal direction) of the wire 1 (see FIGS. 9A and 9B), and a pattern in which the width of an end portion of the wire 1 is reduced by forming a projection at the end portion of the wire 1 (see FIGS. 9C and 9D). These two types of patterns are substantially equivalent from the viewpoint of mitigating strain energy.

As shown in FIG. 1 and FIGS. 5A–8B, it is preferable that the width of the wire 1 in each of the examples is gradually reduced (with a tapered shape) toward the distal end in the longitudinal direction of the wire 1.

According to such a configuration, it is possible to gradually mitigate strain energy which may cause side cracks, and increase the distance of mitigation of strain energy at an end portion of the wire 1.

The expression "the width of the wire 1 is gradually reduced" indicates a state in which the width is narrower toward the distal end of the wire 1 in the longitudinal direction, including a pattern in which the width of the wire 1 is gradually reduced by changing the width stepwise. As shown in FIG. 1 and the like, in some of the examples, an end portion of the wire 1 is divided into a plurality of portions by forming a cut (recess) in the end portion of the wire 1 in a direction substantially parallel to the longitudinal direction of the wire 1.

Accordingly, if, for example, an end portion of the wire 1 is divided into two portions (by forming a cut), strain energy operating in a lateral direction of the wire 1, which may cause peeling or side cracks, is abruptly reduced by ½ at a portion where the wire 1 is divided.

By dividing an end portion of the wire 1 into at least two portions, it is possible to reduce strain energy by an amount equal to or less than ½ (a fraction of the number of divided portions).

Figure 7:
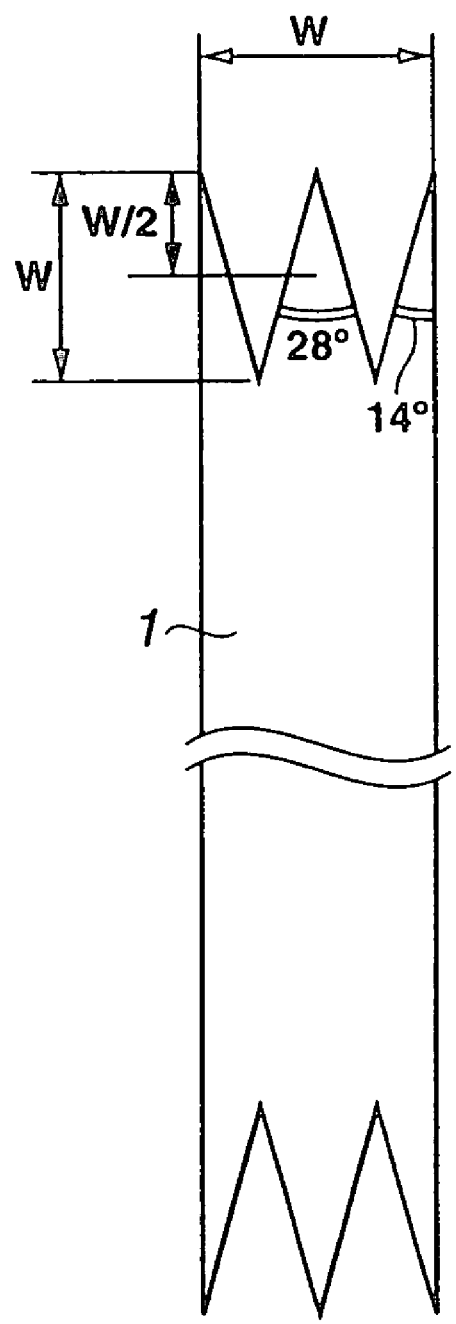
FIG. 7 is a schematic diagram illustrating a wire according to Example 4 of the present invention.

As shown, for example, in FIG. 6A or 7, by providing a pattern of wires in which an end portion of the wire 1 is chamfered, or a plurality of cuts or projections are formed at an end portion of the wire 1, strain energy at the end portion of the one-layer wire 1 can be mitigated.

In the examples, as shown in FIG. 1 and FIGS. 5A–8B, it is desirable that L representing the depth of a cut (recess) (the depth of the recess from the distal end of the wire 1 in the longitudinal direction) or the length from the position where the width of the wire 1 starts to be reduced (the position to start tapering) to the distal end of the wire 1 (the length of a narrow-width portion) is at least ½ of the width W of the wire 1 at a position where the width of the wire 1 starts to be reduced (a portion adjacent to the narrow-width portion).

As shown in FIG. 1 and FIGS. 5A–6B, by making the depth L of the cut to be at least ½ of W, the end portion of the wire 1 can have an acute angle equal to or less than 45 degrees. In such a case, it is possible to increase the distance of mitigation of strain energy for reducing the strain energy toward the distal end. As a result, in addition to the effect of mitigating strain energy in the lateral direction of the wire 1, strain energy at an end portion of the wire 1 can also be gradually mitigated. Hence, the effect of suppressing peeling of end portions and end-portion cracks is further enhanced.

It is only necessary that a so-called paste to be used as the material for fine lines is photosensitive. When using fine lines as wires, a material that is conductive at least in a state in which the fine lines are completed is used. In consideration of using the wires 1 of each of the examples in an image display apparatus, it is preferable to use a so-called "conductive photo-paste" ("photosensitive conductive paste") that is suitable for forming the wires 1 very precisely. The "photo-paste" indicates a paste obtained by adding a photosensitive material to a "conductive paste" containing conductive particles.

Various materials may be used for the "conductive paste". For example, a mixture of conductive particles of a metal or the like, serving as the material for wires, and a low-melting-point glass particles is held in a solvent in the form of a paste (in a state of a liquid having an appropriate viscosity).

An elemental material or a mixed material suitable as a material for wires, such as copper or silver, which has a relatively low resistivity is preferable as the material of the conductive particles. It is preferable to use a conductive paste having silver particles as a main component as the conductive material because it has an excellent-printing property and it can be fired in the atmospheric air.

In some of the examples, the present invention is also applied to insulating fine wires for causing laminated wires to be insulated from each other. In this case, a material capable of realizing insulation is adopted.

FIG. 2A is a diagram illustrating a configuration in which the wires 1 shown in FIG. 1 are formed on a glass substrate 2. FIGS. 2B–2D illustrate a process for forming the wires 1 shown in FIG. 2A on the glass substrate 2 using a photosensitive conductive paste 4, in a cross section taken along line A—A shown in FIG. 2A.

A method for manufacturing the wires 1 according to the present invention will now be described.

First, the photosensitive conductive paste 4 is coated on the glass substrate 2, and is dried if necessary (FIG. 2B).

Each type of glass material may be used for the glass substrate 2. A paste obtained by dispersing conductive particles of a metal or the like, serving as a material for wires, glass particles, a photosensitive organic material in a solvent may be used as the photosensitive conductive paste 4.

Then, a mask 3 having openings (for providing a designed shape of wires) 3a is disposed on the glass substrate 2 having the photosensitive conductive paste 4 coated thereon, and light is projected onto the layer of the photosensitive conductive paste 4 formed on the glass substrate 2 through the openings 3a (FIG. 2C).

Then, by performing a "developing process" in which unnecessary portions of the photosensitive conductive paste 4 are removed, followed by firing, the wires 1 having the pattern shown in FIG. 2A are formed. Accordingly, the "wires" in the present invention include sintered conductive particles.

Although in FIG. 2D, a case of coating the photosensitive conductive paste 4 in two layers is illustrated, the present invention is not limited to the case of forming two layers. The number of layers may be appropriately selected.

The effects of the examples of the present invention are pronounced when the thickness of the wires 1 after firing is at least 5 µm, because of the following reason.

That is, when the thickness of the wires 1 is small, the characteristics of the wires 1 depend on the composition of the photosensitive conductive paste 4, the material of the substrate 2, and the like. If the thickness of the wires 1 is at least 5 µm, particularly at least 10 µm, the tendency of occurrence of the above-described end-portion cracks and side cracks is large. Furthermore, since attenuation of light for exposure is pronounced if the thickness of the wires 1 immediately before exposure is at least 8 µm, the present invention may be particularly suitably applied.

The wires 1 and the substrate 2 using the wires 2 which have been described above are preferably applied to a large-area flat image display apparatus, such as an image display apparatus in which electrons emitted from surface-conduction-type electron emitting devices field-emission (FE)-type electron emitting devices, or MIM-type electron emitting devices are accelerated and impinged upon a phosphor film to emit light, or a plasma display panel (PDP).

The examples of the present invention will now be specifically described.

EXAMPLE 1

FIG. 1 illustrates thick-film wires 1 which very well show characteristics of the shape of wires according to Example 1 of the present invention. FIG. 1 indicates a state in which a plurality of thick-film wires 1 having a predetermined pattern are formed on a substrate (not shown). The shape of an end portion of the thick-film wires 1 is a specific example of the present invention.

An end portion of each of the thick-film wires 1 is divided into two portions by being cut to a depth of W/2 so as to be continuously narrowed toward the distal end, where W is the width of a central portion of the thick-film wire 1 in the longitudinal direction. Accordingly, the edge of the divided portion makes an angle of 45° with respect to the longitudinal direction.

In FIGS. 2A–4, a method for providing matrix wiring by forming lower wires and upper wires on a substrate, assuming a wiring pattern of an image forming apparatus.

In FIGS. 2A–4, there are shown the lower thick-film wires 1, the substrate 2 on which the lower thick-film wires 1 are provided, the mask 3 having the openings 3a corresponding to the shape of wiring, the paste 4 for forming the lower thick-film wires 1, an insulating layer 6 laminated on the lower thick-film wires 1, and upper wires 7 formed on the insulating layer 6.

Figure 3A:
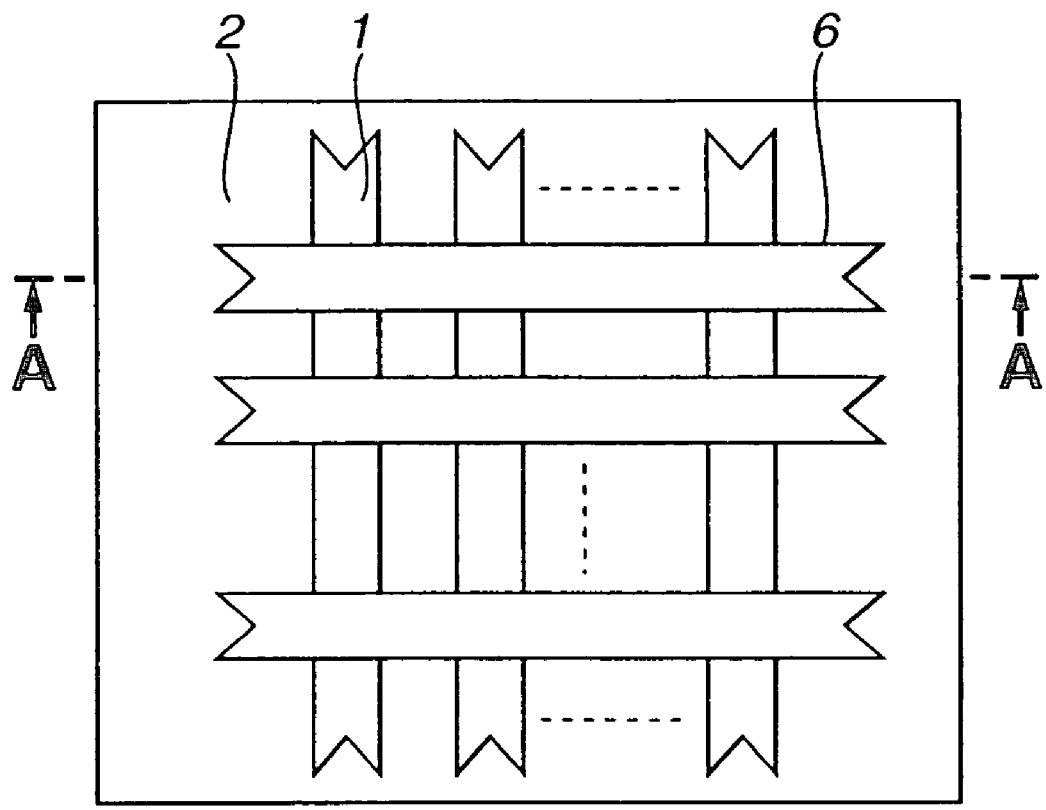
FIGS. 3A and 3B are diagrams illustrating a process for forming an insulating layer in an image forming apparatus using the wires shown in FIG. 1.
Figure 4:
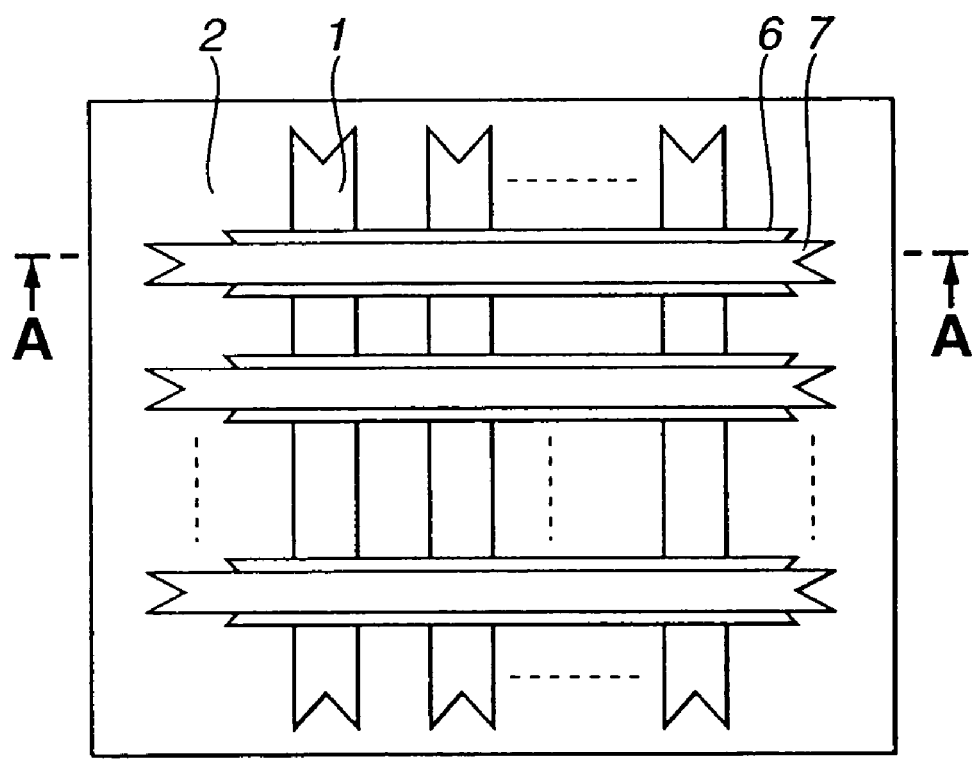
FIG. 4 is a diagram illustrating a process for forming upper wires of the image forming apparatus using the wires shown in FIG. 1.

FIG. 2A is a schematic diagram illustrating a state after forming the lower thick-film wires 1. FIG. 3A is a schematic diagram illustrating a state after forming the insulating film 6. FIG. 4 is a schematic diagram illustrating a state after forming the upper wires 7.

FIG. 2B is a schematic diagram illustrating a state after forming a film of the photosensitive conductive paste 4. FIG. 2C is a schematic diagram illustrating a state during exposure. FIG. 2D is a schematic diagram taken along line A—A shown in FIG. 2A, illustrating a state after development and firming.

Figure 3B:
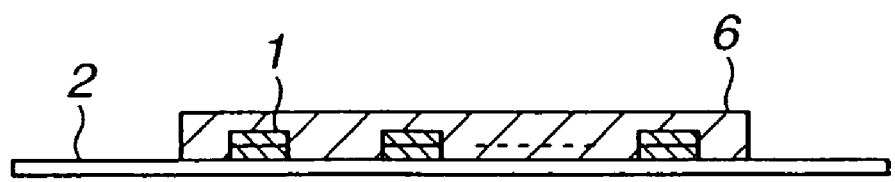

FIG. 3B is a schematic cross-sectional view taken along line A—A shown in FIG. 3A.

First, a description will be provided of a method for forming the lower thick-film wires 1 on the substrate 2 with reference to FIGS. 2A–2E. In FIG. 2B, soda-lime glass was used for the substrate 2. A layer of the photosensitive conductive paste 4 was formed on the substrate 2 according to screen printing. In Example 1, a uniform film was formed on the entire surface of the substrate 2 without performing patterning. However, in order to reduce the amount of use of the film material, a film having a pattern whose area is slightly larger than the area of a latent image to be formed by subsequent exposure may be formed according to screen printing.

The photosensitive conductive paste 4 includes silver as a main component, i.e., about 60–80% of silver particles, and about 20–40% of a glass component, an organic component including a photosensitive material, a glass frit, and a solvent.

A screen of about # (a mesh representing the number of sieves within a square whose side is 25.4 mm long) 150–400 is used based on a desired final film thickness. In Example 1, since the thickness of the film after being dried (before exposure) was set to a value slightly larger than 8 µm, a screen of # 325 was used.

Then, in order to dry the photosensitive conductive paste 4, the film was heated at about 80–150° C. The thickness of the film after being dried was about 10 µm.

Then, as shown in FIG. 2C, desired portions of the film of the photosensitive conductive paste 4 were exposed via the mask 3, shown in FIG. 2E, having the openings 3a whose pattern is similar to the wiring pattern of the thick film wires 1. At that time, as shown in FIG. 2C, exposure light exposes the layer of the photosensitive conductive paste 4 via the openings 3a of the mask 3.

After forming a second layer of the photosensitive conductive paste 4 by performing the same processing as the processing shown in FIGS. 2B and 2C, the first and second layers were simultaneously developed (the thickness of the two layers was 16 µm). After passing through a firing process, as shown in FIG. 2D, the lower thick-film wires 1 having a desired shape of wiring were formed. The firing was performed at about 500° C. The thickness of the film after firing was about 12 µm.

Then, according to processing similar to the processing for forming the lower thick-film wires 1, four layers of a photosensitive insulating paste were formed using a pattern shown in FIG. 3A. After passing through development and firing, as shown in FIG. 3B, the insulating layer 6 was formed so as to prevent the lower thick-film wires 1 from being exposed.

Then, as shown in FIG. 4, upper wires 7 were formed on the insulating film 6 according to processing similar to the processing for forming the lower thick-film wires 1.

Thus, matrix wiring was provided by forming the lower thick-film wires 1 and the upper wires 7 via the interlayer insulating film 6 on the substrate 2.

By using wires having end portions as in Example 1, although side cracks are generated at a central portion of a wire in the longitudinal direction, the side cracks gradually disappear from a portion where the wire is divided by a cut toward the distal end of the wire, because strain energy is mitigated to ½ at that portion and an internal stress is mitigated by the gradual decrease of the width of the wire. In addition, according to the above-described effects, end-portion cracks and peeling of wires did not occur.

EXAMPLE 2

FIGS. 5A and 5B illustrate thick-film wires 1 representing characteristics of the shapes of wires according to Example 2 of the present invention. FIG. 5A illustrates a thick-film wire 1 in which the edge of each of two portions divided by a cut makes an angle of 30° with the longitudinal direction of the wire. FIG. 5B illustrates a thick-film wire 1 in which the edge of each of two portions divided by a cut makes an angle of 15° with the longitudinal direction of the wire.

In Example 2, the length L of the cut is set to a value equal to or more than W/2, where W represents the width of a central portion of the thick-film wire 1 in the longitudinal direction.

Matrix wiring was formed by using the thick-film wires 1 shown in FIG. 5B as lower thick-film wires and thick-film wires 1 shown in FIG. 5A as upper thick-film wires, according to the same processing as in Example 1. A screen of #200 was used for the lower thick-film wires. The thickness of two layers of the lower thick-film wires was 12 μm after being dried, and 18 μm after firing. The thickness of the upper thick-film wires was 18 μm after firing.

By using the thick-film wires 1 having the shapes of end portions as in Example 2, although the thickness was larger than in Example 1, the effect of mitigating a stress was further pronounced because the depth of the cut was at least W/2 and the angle of the end portion of the wire was more acute. As a result, end-portion cracks and peeling of the wires did not occur.

EXAMPLE 3

FIGS. 6A and 6B illustrate thick-film wires 1 representing characteristics of the shapes of wires according to Example 3 of the present invention.

FIG. 6A is a schematic diagram illustrating a thick-film wire 1 in which the depth of a cut from the distal end of the wire was at least W/2 and chamfering was performed to a depth equal to the width of a central portion of the wire (W) (with an angle made by two edges of a divided portion of the wire of about 53°).

FIG. 6B is a schematic diagram illustrating a thick-film wire 1 in which the depth of a stepwise cut from the distal end of the wire was W.

According to the same processing as in Example 1, matrix wiring was provided by using the thick-film wires 1 shown in FIG. 6A as lower wires, and thick-film wires 1 shown in FIG. 6B as upper wires. A screen of #200 was used for the lower wires. The thickness of two layers of the lower thick-film wires was 12 μm after being dried, and 18 μm after firing. The thickness of the upper thick-film wires was 18 μm after firing.

By using the thick-film wires 1 having the shapes of end portions as in Example 3, although the thickness was larger than in Example 1, the effect of mitigating a stress was enhanced because the depth of the cut was at least W/2 and the angle of the end portion of the wire was more acute. As a result, end-portion cracks and peeling of the wires did not occur.

EXAMPLE 4

FIG. 7 illustrates a thick-film wire 1 representing characteristics of the shapes of wires according to Example 4 of the present invention.

An end portion of the thick-film wire 1 shown in FIG. 7 is divided into three portions by two V-shaped cuts having a depth of W, which is more than W/2, from the distal end of the thick-film wire 1 (with an angle made by an edge of each of two side portions and a corresponding side of the thick-film wire 1 of 14° and an angle made by two edges of the central portion of 28°).

According to the same processing as in Example 1, matrix wiring was provided by using the thick-film wires 1 shown in FIG. 7 as lower wires and upper wires. A screen of #200 was used for the lower wires. The thickness of two layers of the lower thick-film wires was 12 μm after being dried, and 18 μm after firing. The thickness of the upper thick-film wires was 18 μm after firing.

By using the thick-film wires 1 having the shapes of end portions as in Example 4, although the thickness was larger than in Example 1, the effect of mitigating a stress was enhanced because the depth of the cut was at least W/2 and the angle of the end portion of the wire was more acute. As a result, end-portion cracks and peeling of the wires did not occur.

EXAMPLE 5

Figure 8A:
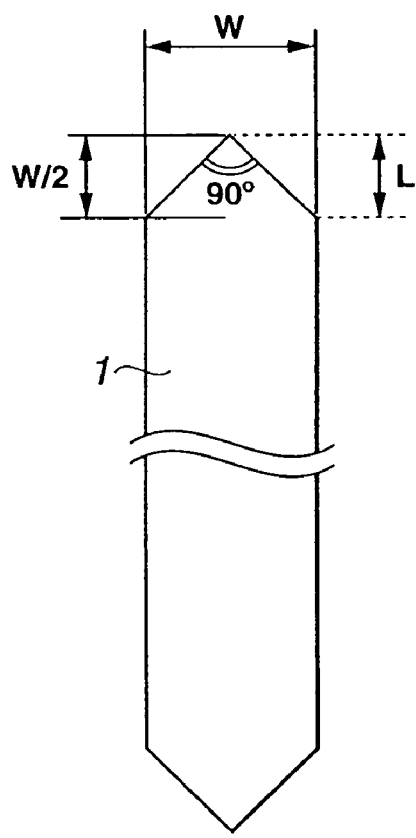
FIGS. 8A and 8B are schematic diagrams, each illustrating a wire according to Example 5 of the present invention.
Figure 8B:
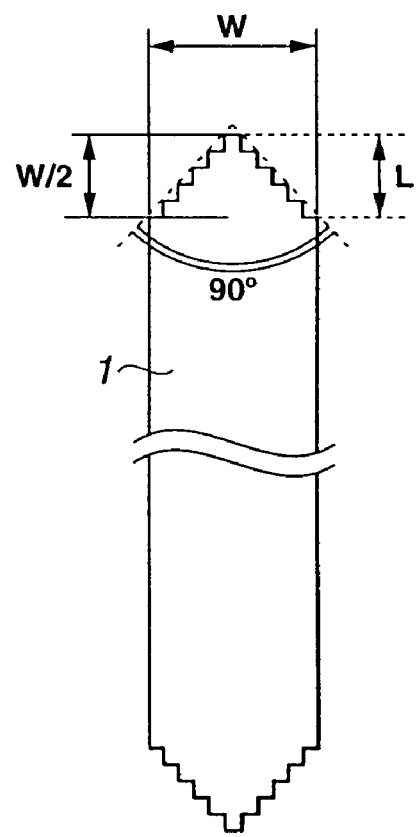

FIGS. 8A and 8B illustrate thick-film wires 1 representing characteristics of the shapes of wires according to Example 5 of the present invention.

FIG. 8A is a schematic diagram illustrating a thick-film wire 1 in which an end portion of the thick-film wire 1 is chamfered toward the distal end to a depth of W/2 with an angle made by two edges of the chamfered portion of about 90°.

FIG. 8B is a schematic diagram illustrating a thick-film wire 1 in which an end portion of the thick-film wire 1 is chamfered stepwise toward the distal end to a depth of W/2 with an angle made by two edges of the chamfered portion of about 90°.

According to the same processing as in Example 1, matrix wiring was provided by using the thick-film wires 1 shown in FIG. 8A as lower wires, and thick-film wires 1 shown in FIG. 8B as upper wires. Only one layer of the thick-film wires 1 was formed for the lower wires. The thickness of the lower thick-film wires was 6 μm after firing. Only one layer of the thick-film wires 1 was also formed for the upper wires. The thickness of the upper thick-film wires was 9 μm after firing. Two insulating layers were formed between the upper wires and the lower wires.

By using the thick-film wires 1 having end portions as in Example 5, although side cracks were generated at a central portion of a wire in the longitudinal direction, peeling did not occur at end portions of the wires because strain energy or a stress is gradually mitigated due to reduction of the area of the wires by chamfering. In the thick-film wires 1 shown in FIG. 8B, since the shape of the accomplished distal end portion was substantially continuous because the wires were formed according to screen printing, the effect of mitigating strain energy or a stress was also continuous.

EXAMPLE 6

FIGS. 9A–9D illustrate thick-film wires 1 representing characteristics of the shapes of wires according to Example 6 of the present invention.

FIG. 9A is a schematic diagram illustrating a thick-film wire 1 in which a central portion of the distal end is cut to a depth of 2W, i.e., twice the width W of a central portion of the thick-film wire 1, to provide a concave portion.

FIG. 9C is a schematic diagram illustrating a thick-film wire 1 in which both sides of the distal end are cut to a depth of 2W, as in the case of FIG. 9A, to provide a convex portion.

According to the same processing as in Example 1, matrix wiring was provided by using a mask for the thick-film wires 1 shown in FIG. 9A for lower wires, and a mask for thick-film wires 1 shown in FIG. 9C for upper wires. However, when forming the lower wires and the upper wires, the mask was separated from the substrate by about 200 μm during exposure, and the exposure time was made slightly longer.

Each of the obtained upper and lower thick-film wires 1 was round at corner portions as shown in FIG. 9B.

By using the thick-film wires 1 having end portions as in Example 6, although side cracks were generated at a central portion of a wire in the longitudinal direction, cracks and peeling did not occur at end portions of the wires because strain energy or a stress is mitigated due to the effect of dividing the area of the pattern and the effect of narrow end portions, and roundness of end portions.

EXAMPLE 7

Figure 10:
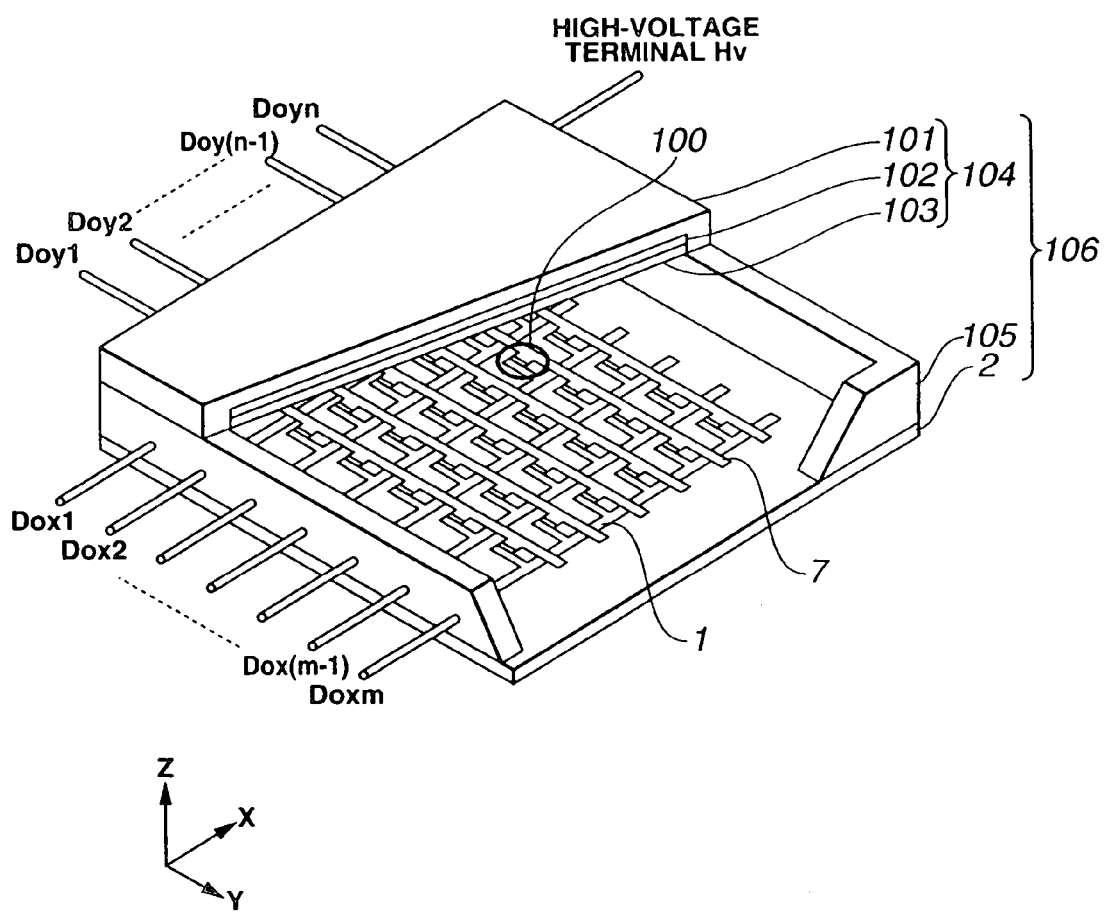
FIG. 10 is a schematic perspective view illustrating an image forming apparatus according to Example 7 of the present invention.

In Example 7 of the present invention, an image forming apparatus shown in FIG. 10 was manufactured. In Example 7, surface-conduction-type electron emitting devices 100 shown in FIG. 10 were used as electron emitting devices.

A method for manufacturing electron sources and the image forming apparatus according to Example 7 will now be described with reference to FIGS. 11A–13B.

(1) A substrate 2, serving as a rear plate, in which a $SiO_2$ film 0.5 μm thick was formed on the surface of soda-lime glass according to sputtering, was prepared.

Figure 11A:
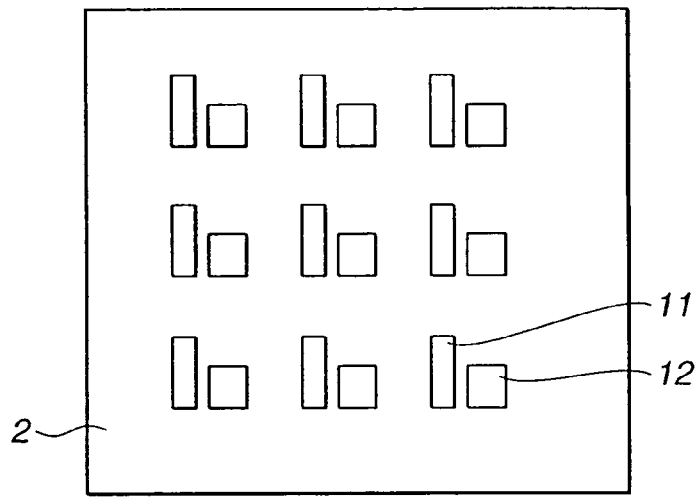
FIGS. 11A–13B are diagrams illustrating processes for manufacturing the image forming apparatus shown in FIG. 10.

(2) 1,000 pairs and 5,000 pairs of electrodes 11 and 12 were formed on the substrate having the $SiO_2$ film formed thereon in the x direction and the y direction, respectively (see FIG. 11A).

Figure 11B:
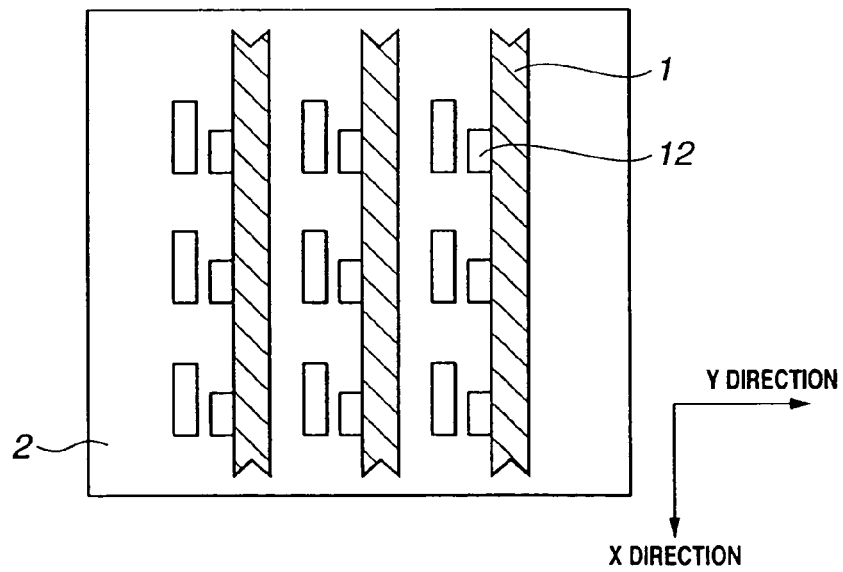

In FIGS. 11A and 11B, in order to simplify explanation, three pairs of electron emitting devices 100 in each of the x direction and the y direction, i.e., 9 devices in total, are shown.

In Example 7, Pt was used as the material for forming the electrodes 11 and 12. The electrodes 11 and 12 were formed according to photolithography. The interval between the electrodes 11 and 12 was 20 μm.

(3) A photosensitive conductive paste was coated on the entire surface of the substrate 2, serving as the rear plate, having the electrodes 11 and 12 formed thereon, to provide a layer. The photosensitive conductive paste used in Example 1 was used.

(4) Then, the layer was dried, and ultraviolet exposure light was projected onto the dried layer using the light-blocking mask 3 having the openings 3a (see FIG. 11B) used in Example 1.

(5) Then, by cleaning the substrate 2, serving as the rear plate, by an organic solvent, unexposed portions were removed (development) to form a developed pattern.

(6) Then, by firing the substrate 2, serving as the rear plate, 5,000 lower thick-film wires 1 having the pattern shown in FIG. 11B were formed with a pitch of 180 μm. In this process (6), since a part of the electrodes 12 was covered with the lower thick-film wires 1, the electrodes 12 were connected to the lower thick-film wires 1.

Figure 12A:
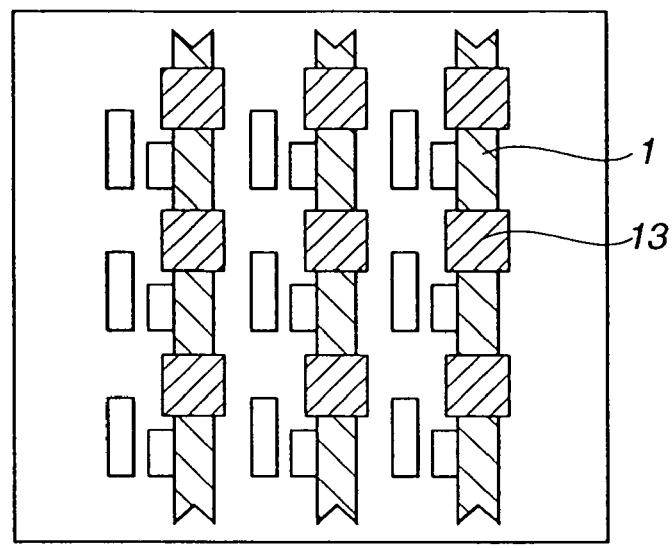

(7) Then, according to a printing method, an insulating paste including a glass binder and a resin was coated at respective intersections of already formed column-direction wires 6 and upper wires 7 to be formed at the next process, and was fired to form insulating layers 13 (see FIG. 12A). In Example 7, the insulating layers 13 were formed only at the respective intersections of the lower wires and the upper wires 7 instead of extending along the upper wires 7, so that the upper wires 7 can be connected to device electrodes provided below the upper wires 7 simultaneously with formation of the upper wires 7 to be described below.

Figure 12B:
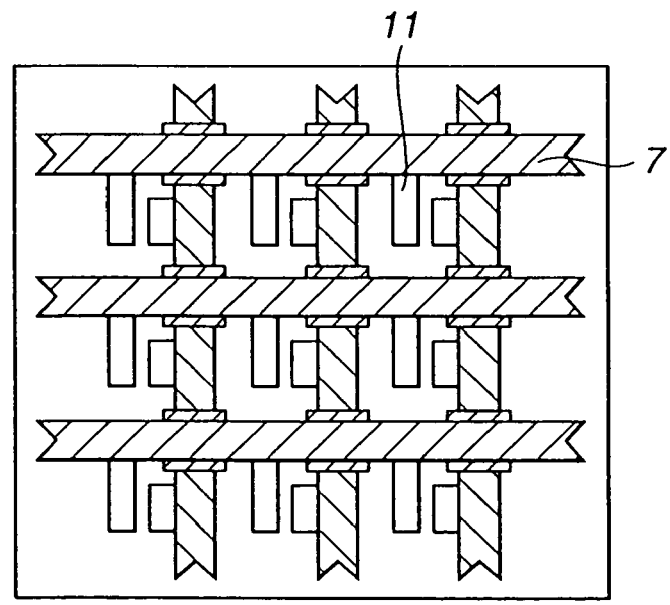
Figure 13A:
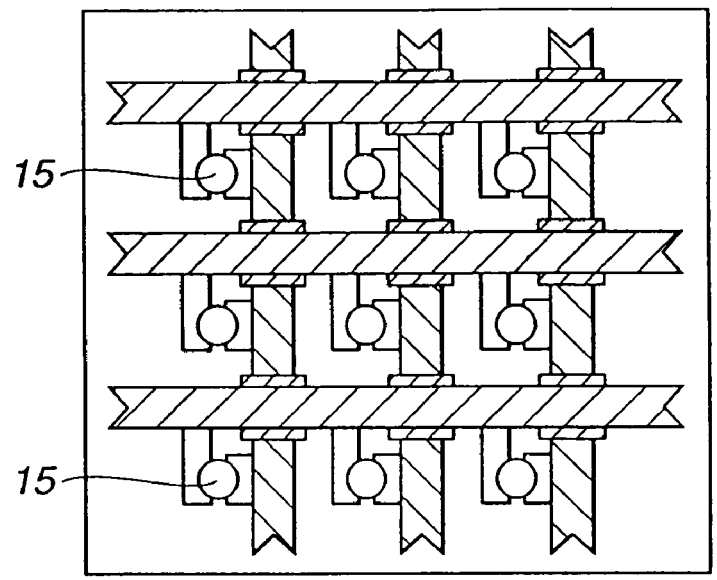
Figure 13B:
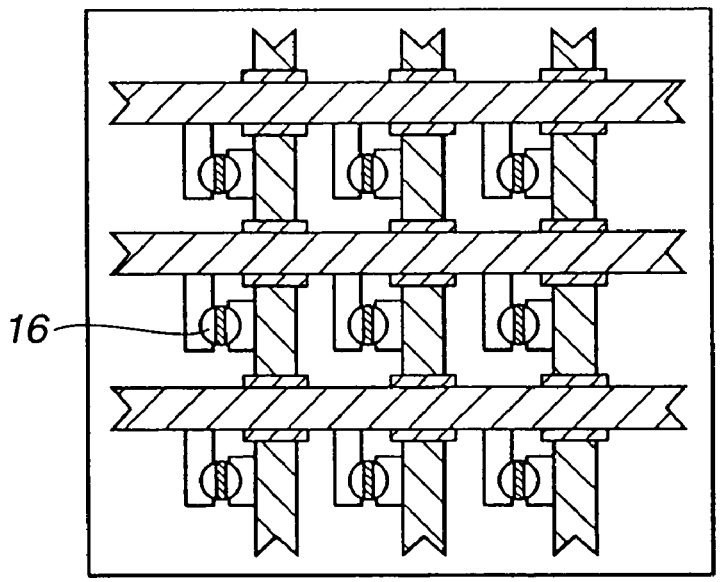
Figure 14A:
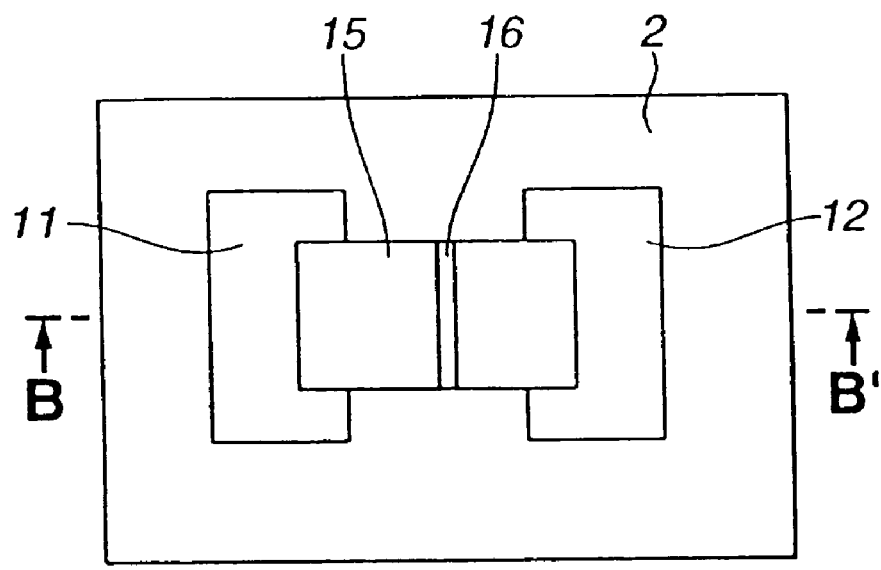
FIGS. 14A and 14B are diagrams illustrating an electron emitting device.
Figure 14B:
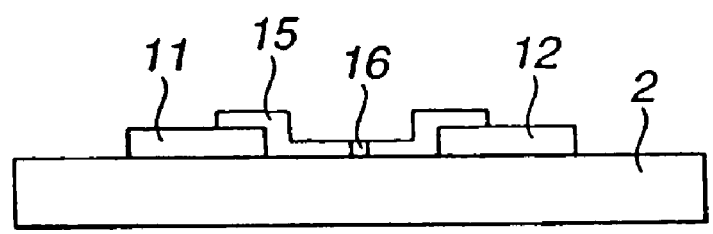
Figure 15:
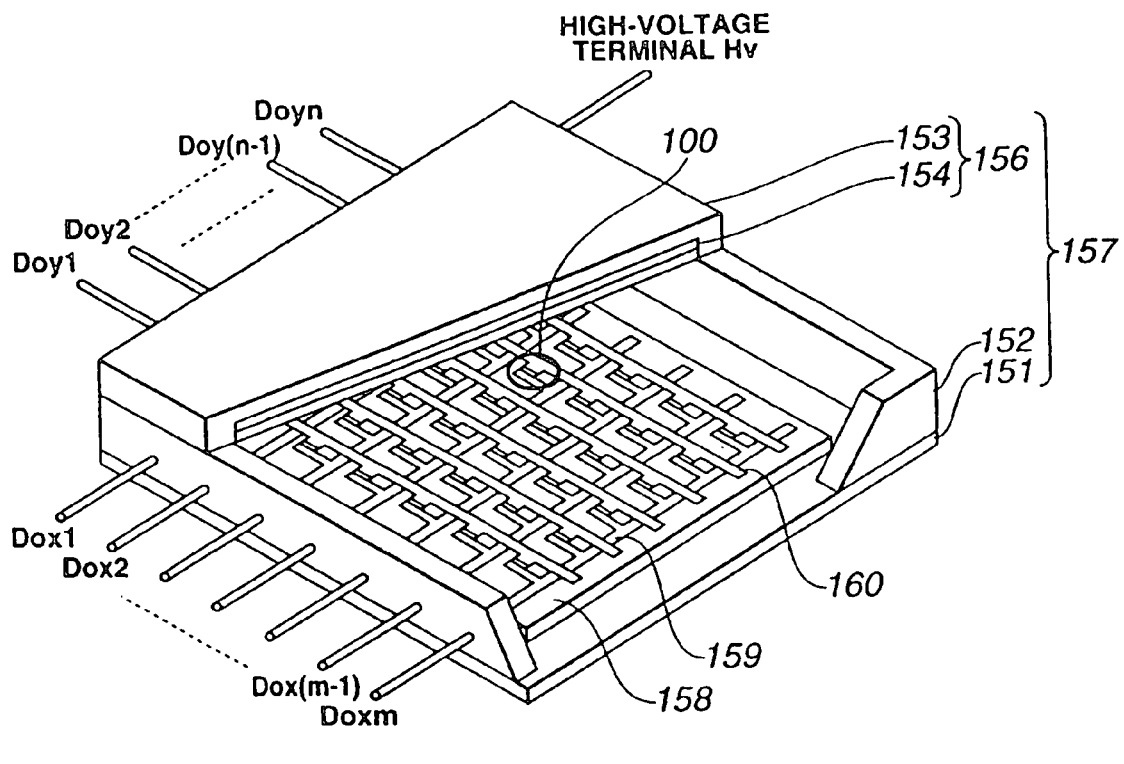
FIG. 15 is a schematic perspective view illustrating an image forming apparatus according to a conventional technique.

(8) Then, 1,000 upper wires 7 were formed in the same manner as the formation of the lower wires (see FIG. 12B). In this process (8), since a part of the electrodes 12 is covered by the upper wires 7, the upper wires 7 are connected to the electrodes 12. The upper wires 7 were formed so that the width of a central portion of the wire 7 is 150 μm, and the pitch between adjacent wires is 50 μm.

(9) Then, an aqueous solution including Pd was coated on gap portions between corresponding ones of the electrodes 11 and 12. By firing the coated solution in the atmospheric air at 350° C, conductive films 15 made of PdO were formed (see FIG. 13A).

According to the above-described processes, the electron-source substrate (rear plate) 2 before forming was formed.

(10) The electron-source substrate 2 before forming formed according to the above-described processes was disposed within a vacuum chamber. After evacuating the inside of the chamber to $10^{-4}$ Pa, a "forming process" in which a pulse-shaped voltage is sequentially applied to the upper wires 7 while maintaining the lower wires 1 to 0 V was performed. According to this process, a current was caused to flow in each of the conductive films 15, to form a gap at a part of the conductive film 15.

(11) A Process called an activation process was performed for the devices after the forming process. After evacuating the inside of the chamber to $10^{-6}$ Pa, $1.3\times10^{-4}$ Pa of benzonitrile was introduced, and the "activation process" in which a pulse-shaped voltage is repeatedly applied to the upper electrodes 7 while maintaining the lower wires 1 to 0 V was performed. According to this process, a carbon film was formed on a portion inside and near the gap of each of the conductive films 15, to form electron emitting portions 16 (see FIG. 13B).

Electric characteristics of the electron-source substrate 2 formed according to the above-described processes were evaluated. The result of evaluation indicated that insulation between the upper wires 7 and the lower wires 1 was sufficiently secured.

Next, a method for forming a faceplate 104 shown in FIG. 10 will be described.

(12) First, a faceplate substrate 101 made of the same material as the material for the substrate 2, serving as the rear plate, was sufficiently cleaned and dried. Then, a black member was formed on the substrate 101 according to photolithography. The black member was formed in the shape of a grid so as to provide openings corresponding to portions where respective phosphors are to be provided. The pitch of the black member in the y direction is the same as the pitch of the lower thick-film wires 1, and the pitch of the black member in the x direction is the same as the pitch of the upper wires 7.

(13) Red, blue and green phosphors were formed at the openings of the black member according to screen printing.

(14) Then, a filming layer was formed on the black member and the phosphors. A solution obtained by dissolving a polymethylmethacrylate-type resin in an organic solvent, serving as the material for the filming layer, was coated according to screen printing, and was dried.

(15) Then, an Al layer was formed on the filming layer according to vacuum deposition.

(16) Then, the resin and the filming layer contained in phosphor pastes were removed by heating the faceplate 104, to obtain the faceplate 104 in which an image forming member 102, serving as a phosphor layer including the phosphors and the black member, and a metal back 103 are formed on the substrate 101.

(17) An external frame 105 in which a spacer (not shown) having a high-resistance film on a surface thereof and a connecting member were provided in advance was disposed between the substrate 2, serving as the rear plate, and the faceplate 104 which were formed according to the above-described processes.

By heating and pressing the above-described assembled members in a vacuum in a state in which alignment between the faceplate 104 and the substrate 2, serving as the rear plate, was sufficiently performed, the respective members were connected by softening the connecting member. According to this sealing process, an envelope (a display panel) 106 shown in FIG. 10, serving as an image forming apparatus whose inside is maintained in a high vacuum was obtained.

A driving circuit was connected to a leading wiring portion (end portions of the wires) guided from the inside of the display panel 106 obtained in the above-described manner via a flexible printed circuit board, and a moving image was displayed according to dot-sequential scanning.

When moving images were displayed on the display panel 106 obtained in the above-described manner, very precise and very bright images could be obtained for a long time. When a flexible printed circuit board was connected to leading portions (end portions) of the upper wires 7 and the lower thick-film wires 1, peeling of the wires did not occur. In addition, defects in pixels considered to be caused by discharge were not produced.

Figure 18:
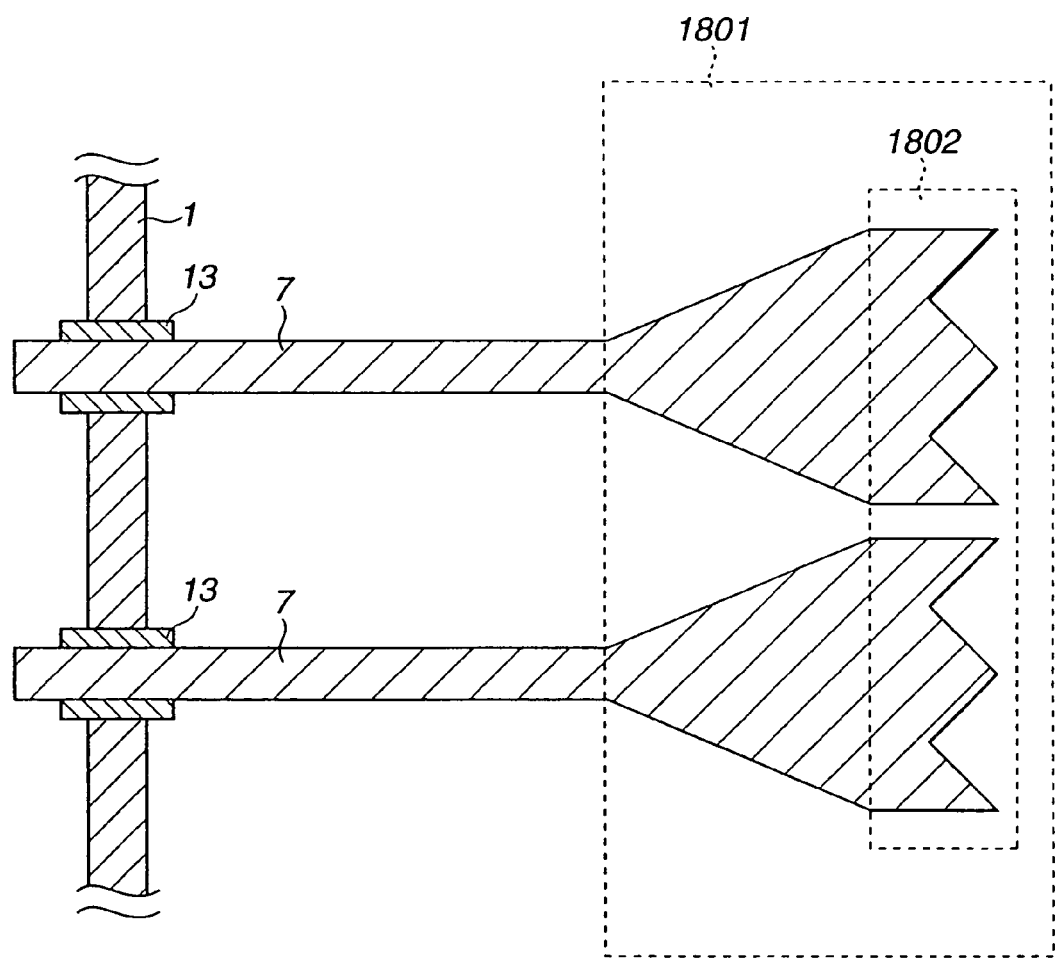
FIG. 18 is a diagram illustrating a configuration in which the present invention is applied to a leading portion of each wire.

When using fine lines according to the present invention as wires, it is preferable to form a portion connected to a plurality of display devices and a leading portion from a portion where the plurality of display devices are formed, as a group of wires. In this case, it is preferable to make the width of the leading portion in wiring wider than the width of the portion connected to the plurality of display devices, in order to reduce electric resistance. FIG. 18 illustrates such a configuration. In FIG. 18, reference numeral 1801 represents a leading portion in wiring. In this configuration, particularly, peeling of end portions may cause a problem. However, as shown in FIG. 18, by reducing the widths of end portions 1802, peeling of end portions can be suppressed.

As described above, the generation of end-portions cracks and peeling of end portions could be suppressed. In addition, by mitigating strain energy of side cracks, connection of a side crack and an end-portion crack did not occur, and peeling of wires could be prevented.

Accordingly, peeling of end portions can be very well suppressed at leading portions of wires, and the problem that device mounting cannot be performed due to peeling of a flexible printed circuit board or tabs together with the entire wiring during device mounting using the flexible printed circuit board or tabs disappears. Since end portions are not raised at other portions, the problem of short circuit due to contact with the other portions disappears. Since chipping and leaving are absent, the problem of short circuit disappears, and the problem of instability of the shapes of various markers, such as alignment marks and the like, also disappears.

Accordingly, the present invention is suitable as a thick-film-wire substrate of a large-area flat image display apparatus having surface-conduction-type electron emitting devices.

The substrate of the present invention is also suitable not only when using electron emitting devices, for example, FE devices, such as spindt-type electron emitting devices or the like, surface-conduction-type emitting devices, or MIM-type electron emitting devices, as image display devices, but also as a substrate having wires used in a liquid-crystal display apparatus, a plasma-display panel (in this case, a portion corresponding to each pixel operates as an image display device), or a very-small-integrated-mirror-type image display apparatus. Furthermore, the present invention may be suitably applied not only when using the fine line of the present invention as a wire, but also when the fine line of the present invention is used as a rib for separating adjacent pixels, for example, in a plasma display panel.

The individual components shown in outline in the drawings are all well known in the substrate and image display apparatus arts and their specific construction and operation are not critical to the operation or the best mode for carrying out the invention.

While the present invention has been described with respect to what are presently considered to be the preferred embodiments, it is to be understood that the invention is not limited to the disclosed embodiments. To the contrary, the present invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A method of manufacturing a substrate having a fine line on a substrate face, said method comprising:

a fine-line forming step of forming the fine line on the substrate face, wherein an end portion of the fine line in a longitudinal direction is divided into a plurality of disjoined narrow width portions, and the fine line is formed so that a width of the disjoined narrow-width portions in a parallel direction to the substrate face is smaller than a width of a portion of the fine line adjacent to the fine line end portion divided into the plurality of disjoined narrow-width portions, and in a section of the fine line cut in the direction of a normal line on the face forming the fine line on the substrate, the section comprises a part which is away from the substrate-side-end of the section, and a length of a part of the section in the parallel direction to the substrate face is longer than a length of the substrate-side-end of the section in the parallel direction to the substrate face with sides extending diagonally outward from the substrate face, said fine-line forming step comprising:

(i) a step of providing a photosensitive material onto the substrate;

(ii) a step of projecting light from above the substrate onto a predetermined region on the photosensitive material; and (iii) a developing step after said step of projecting light.

2. A method according to claim 1, wherein the fine-line is a wire connected to a device.

* * * * *

UNITED STATES PATENT AND TRADEMARK OFFICE
CERTIFICATE OF CORRECTION

PATENT NO. : 7,052,825 B2
APPLICATION NO. : 10/781790
DATED : May 30, 2006
INVENTOR(S) : Yoshimi Uda et al.

It is certified that error appears in the above-identified patent and that said Letters Patent is hereby corrected as shown below:

ON THE TITLE PAGE
  Item "(30) Foreign Application Priority Data," the listed documents:

"Dec. 15, 2000  (JP) ........................ 2000/382331
   Nov. 21, 2001  (JP) ........................ 2001/356554" should read --Dec. 15, 2000 (JP) ........................ 2000-382331
   Nov. 21, 2001  (JP) ........................ 2001-356554 --.

ON THE TITLE PAGE:
  Item "(57)  ABSTRACT," the current abstract should be deleted and the following inserted therefor:

-- A method for manufacturing a substrate having a fine line. The method includes a fine-line forming step of forming the fine-line, wherein a narrow-width portion is provided at an end portion of the fine line in a longitudinal direction, and the fine line is formed so that a width of the narrow-width portion is smaller than a width of a portion adjacent to the narrow-width portion. The fine-line forming step includes a step of providing a photosensitive material onto the substrate, a step of projecting light from above the substrate onto a predetermined region on the photosensitive material, and a developing step after the light projection step. --

COLUMN 2:
   Line 33, "cleared" should read -- shown--.

UNITED STATES PATENT AND TRADEMARK OFFICE
CERTIFICATE OF CORRECTION

PATENT NO. : 7,052,825 B2
APPLICATION NO. : 10/781790
DATED : May 30, 2006
INVENTOR(S) : Yoshimi Uda et al.

It is certified that error appears in the above-identified patent and that said Letters Patent is hereby corrected as shown below:

<u>COLUMN 8:</u>
Line 43, "and a" should read -- and --.

Signed and Sealed this

Second Day of January, 2007

JON W. DUDAS
*Director of the United States Patent and Trademark Office*